United States Patent

Hermanns

[15] 3,700,155

[45] Oct. 24, 1972

[54] APPARATUS FOR IMPROVING ALIGNMENT OF BEAM LEADED BONDING TOOLS

[72] Inventor: Leonard S. Hermanns, Woburn, Mass.

[73] Assignee: Mech-El Industries, Inc., Woburn, Mass.

[22] Filed: May 20, 1970

[21] Appl. No.: 39,022

[52] U.S. Cl. ........................228/3, 29/203, 29/470.1, 29/577, 228/1, 228/4

[51] Int. Cl. ............................B23k 21/00, B23p 3/02

[58] Field of Search ......228/1, 3, 3.5, 4, 5; 29/470.1, 29/497.5, 626, 592; 78/82

[56] References Cited

UNITED STATES PATENTS

| | | | |
|---|---|---|---|
| 3,116,655 | 1/1964 | Esopi | 78/82 |
| 3,149,510 | 9/1964 | Kulicke, Jr. | 78/82 |
| 3,263,057 | 7/1966 | Conti | 219/78 |
| 3,459,355 | 8/1969 | Metzger, Jr. | 228/1 |
| 3,475,814 | 11/1969 | Santangini | 29/497.5 X |

*Primary Examiner*—John F. Campbell
*Assistant Examiner*—R. J. Craig
*Attorney*—James J. Cannon, Jr.

[57] ABSTRACT

An improved bonding tool and method permitting improved accurate relative alignment of a bonding tool, a beam leaded device and a substrate onto which electrical leads from the beam leaded device are to be welded or bonded. Particular use is made of a unique reference area or point provided on the tool itself to aid in the alignment processes and in the preferred embodiment, a mirror surface is utilized to support the beam leaded device during alignment of this device with a reference point on the tool thus further facilitating detection of minor relative misalignments which can then be corrected by an operator.

3 Claims, 4 Drawing Figures

PATENTED OCT 24 1972

3,700,155

INVENTOR

LEONARD S. HERMANNS

BY Cushman, Darby & Cushman

ATTORNEYS

APPARATUS FOR IMPROVING ALIGNMENT OF BEAM LEADED BONDING TOOLS

Figure 1:
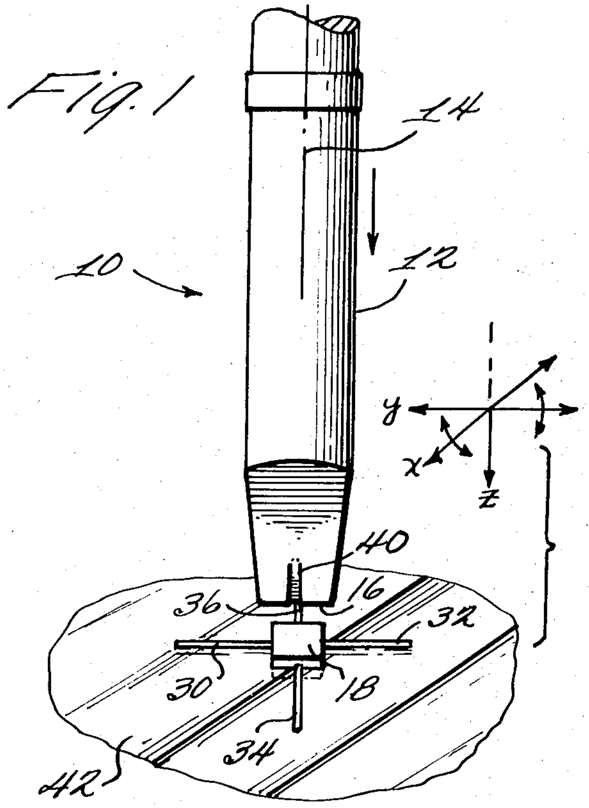

This invention relates generally to an improved method and apparatus for bonding electrical leads from a beam leaded device chip onto a substrate. Specifically, the invention is directed to an improvement in both method and apparatus which results in more accurate relative alignment of the bonding tool itself, the beam leaded device and the substrate prior to the actual welding or bonding of the electrical leads onto mating substrate surfaces.

This invention is a distinct improvement over prior methods and tools and may be added to such existing devices as that shown in U.S. Pat. No. 3,448,911 to Cushman to further improve their operation.

In the electrical art, especially since the coming of integrated circuits, it is often necessary to bond many individual electrical leads extending from a so-called beam leaded device or chip onto a substrate material which may contain mating conducting surfaces for respective bonding with each of the individual leads from the chip device. The chip device may for instance constitute an integrated circuit subcomponent of a larger and more complicated electrical circuit and by connecting several such integrated circuit devices together onto a common substrate containing interconnecting conducting areas, a composite completed electrical device may be fabricated using such beam leaded chips as integral building blocks.

It would be possible of course to individually weld each of the tiny projecting leads from the chip onto its corresponding mating surface of the substrate; however, this process would be time consuming and laborious as well as somewhat inaccurate. Consequently, bonding tools have been developed in the prior art for simultaneously bonding all the leads from such a beam leaded chip device onto a substrate in a single bonding or welding step.

While these prior art welding tools are indeed an improvement over individual lead welding processes, there are still considerable disadvantages and problems associated with such prior art devices and associated methods for simultaneously bonding the leads from a beam leaded device. One of the primary problems in this area is proper relative alignment of the beam leaded device with respect to both its mating substrate surfaces and the bonding tool itself.

Accordingly, it is an object of this invention to provide an improved bonding tool and a method for using it which permits a greatly improved relative alignment between these three relatively movable elements prior to the actual bonding of the leads to the substrate surface. The improved results obtained by using this invention are achieved by utilizing a unique reference point or area on the bonding tool itself to first align the tool with respect to the beam leaded device, then fix the tool relative to the beam leaded device and subsequently to use the same unique reference point to aid in aligning the tool (including the attached already aligned beam leaded device) with respect to the mating surfaces of a substrate prior to actually welding the leads.

Another object of this invention is to even further facilitate relative alignment of the beam leaded device with a unique reference point on the tool by supporting the beam leaded device on a mirror surface during the alignment process to greatly enhance a detection of even relatively minor misalignments and thereby allow an operator to make appropriate corrections.

Figure 2:
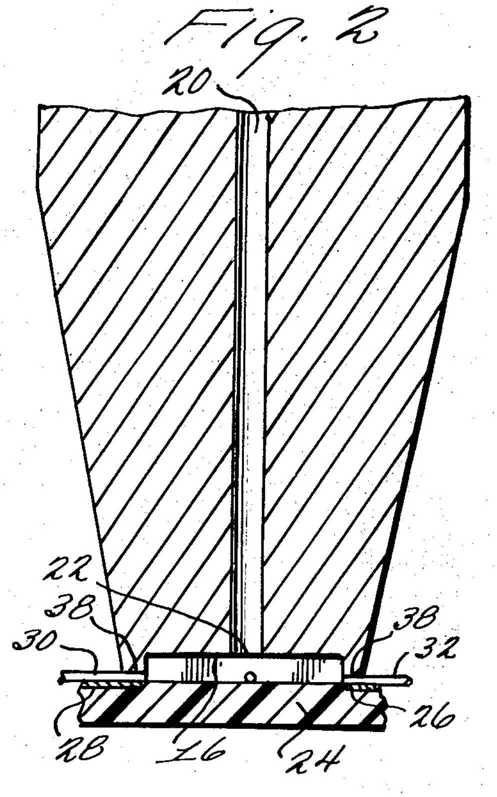
Figures 3, 4:
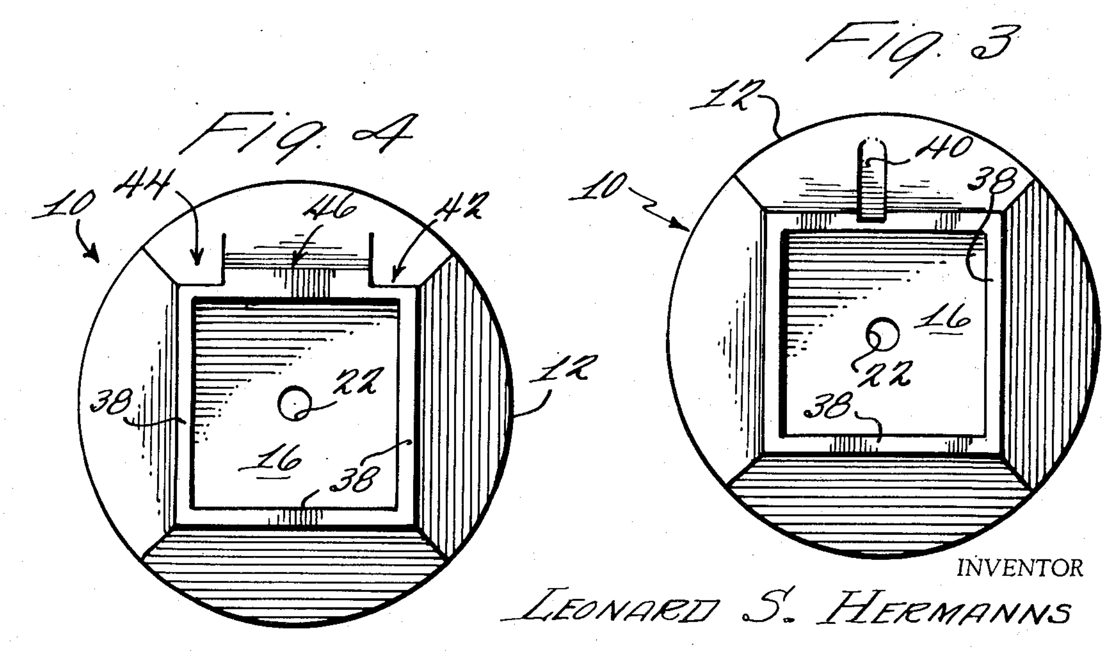

A more complete and detailed understanding of this invention may be obtained by carefully studying the following detailed description in combination with the drawings, of which:

FIG. 1 represents a pictorial view of the bonding tool of this invention in use during a portion of the alignment process of this invention, FIG. 2 is a cross-sectional view of the devices shown in FIG. 1 during a later stage of an alignment process, FIG. 3 is a pictorial end view of a bonding tool constructed according to the teachings of this invention, and FIG. 4 is a pictorial end view of a modified bonding tool constructed according to the teachings of this invention.

As shown in FIG. 1 a bonding tool 10 is generally comprised of a main body portion 12 having a longitudinal center axis 14 and terminating in an end surface 16 which is adapted to receive and hold the main body 18 of a beam leaded chip device. For instance, as shown in the other figures, end portion 16 of the bonding tool of this illustrative embodiment is shown as comprised of a generally square or rectangularly shaped recess which is generally dimensioned slightly larger than the body of the beam leaded chip device 18 for which the tool is designed.

In general, the bonding tool 10 is lowered down onto a beam leaded chip device 18 to which it is then temporarily attached in a substantially immovable fashion to prevent unwanted movements between the beam leaded device and the bonding tool. As shown in FIG. 2, a vacuum line 20 is provided on the interior of the bonding tool 10 terminating at 22 on the top surface of the recess 16 designed to receive the beam leaded device within the end portion of the bonding tool. Thus, the beam leaded device and the bonding tool may be fixed relative to each other by applying a partial vacuum through conduit 20 at point 22 between at least a portion of the beam leaded device and the bonding tool. Subsequently, the relatively fixed beam leaded device and bonding tool are lowered upon a substrate 24 having mating conducting portions such as shown by reference numerals 26 and 28 to which electrical leads such as 30 and 32 are to be bonded by the application of a bonding energy such as heat or ultrasonic vibrations delivered through a bonding surface 38 which, in the illustrated embodiment, forms a rim about the periphery of the recess 16 at the end of bonding tool 10.

The particular improvement afforded by this invention is for the purpose of permitting more accurate alignment between the bonding surface 38, electrical leads 30 and 32 and the mating conducting surfaces 26 and 28 on substrate 24 prior to the application of some type of bonding energy through bonding tool 10.

As shown in FIG. 1, bonding tool 10 is provided with a unique and salient reference point or area 40 which in the illustrative device of FIG. 1 takes the form of an indentation or notch in one side of the rectangularly shaped bonding surface 38. As the bonding tool 10 is advanced towards the beam leaded device 18 along its longitudinal axis 14 (parallel to the Z axis as shown by the set of rectangular coordinates in FIG. 1), the tool may also be translated in any desired direction transverse to this general longitudinal movement. That is, the tool may be translated along the X or Y axes or rotated about the Z axis to accurately align reference portion 40 with respect to at least one electrical lead projecting from the beam leaded device 18 such as lead 34 as shown in FIG. 1. In this manner, the bonding tool 10 may be very accurately aligned with respect to the electrical leads of beam leaded device 18 before applying a partial vacuum through internal chamber 20 to relatively fix the beam leaded device with respect to the bonding tool.

An even further improvement in the alignment process for aligning bonding tool 10 with beam leaded device 18 involves placing beam leaded device 18 upon a translucent base member having a highly reflective or mirror surface 42 during the alignment process. A highly reflective surface 42 on the bottom of a piece of glass or other translucent material enables the operator to control the distance of the reflective surface 42 from the leads 32,34 of the device 18 and from the bonding surface 38 of the bonding tool 10. In this manner, an operator may easily detect misalignments of reference portion 40 with respect to particular selected electrical leads projecting from the beam leaded device and make appropriate corrections by translating along the X-Y axes or rotating about the Z axis while the tool is being lowered along its longitudinal axis 14 over the beam leaded device.

After the bonding tool 10 and beam leaded device 18 have been thus aligned and fixed with respect to one another, the bonding tool with the attached beam leaded device is moved over a substrate 24 as shown in FIG. 2. Again, while the bonding tool 10 is being lowered onto the substrate, the reference portion 40 is again aligned with respect to particular point or area on substrate 24 by translation or rotation transverse to the main longitudinal movements of bonding tool 10. Finally, as shown in FIG. 2, the mating conducting areas 26 and 28 on substrate 24 are accurately aligned with respect to reference portion 40 which has been previously alined with respect to extending electrical leads from beam leaded device 18. Since the bonding tool 10, beam leaded device 18 and substrate 24 are now all respectively properly positioned, a welding or bonding energy such as ultrasonic vibrations, heat or pressure or any other appropriate bonding energy may be applied through bonding tool 10 to bond leads 30 and 32 to mating conducting elements 26 and 28 on substrate 24. It should be understood that the aligning movements of the bonding tool can be performed either simultaneously with or independently of the general longitudinal movements of the tool. Furthermore, any number of electrical leads may be involved in the alignment and bonding process.

An end view of the illustrative bonding tool shown in FIGS. 1 and 2 is pictorially depicted in FIG. 3 to more clearly show the slot or notch 40 disposed along the mid portion of one side of bonding surface 38 which extends about the periphery of holding area 16 on the end surface of bonding tool 10. It should be obvious to those skilled in the art that reference slot 40 could be alternatively formed as a raised projection, or could be moved to other desired positions along bonding surface 38 depending upon the nature of the substrate 24 and beam leaded device 18 for which the tool is designed. Of course the tool is not necessarily designed for only a particular substrate but rather, the more usual practice would probably be to design the beam leaded device and substrate for use with a common tool. It should also be obvious that more than one reference portion could be utilized if that were felt to be desirable.

A modified form of the tool shown in FIGS. 1, 2 and 3 is shown in an end pictorial view at FIG. 4. Here the reference slot 40 has been replaced by two notches 42 and 44 placed on adjacent corners of one side of portion surface 38. This of course leaves a raised boss portion 46 disposed between the two notches and the alignment process can be carried out by aligning either or both of the notches or even the raised boss portion with respect to electrical leads extending out from the beam leaded device 18.

While only a few illustrative embodiments of this invention have been particularly and specifically described in the foregoing specification, it should be obvious to those skilled in the art that the basic invention revealed by the foregoing description may be variously modified and adapted in many different ways while yet retaining the essential features which permit the improved alignment of the beam leaded chip, the bonding tool and a substrate as described above. Accordingly, such modifications are intended to be included within the scope of this invention.

What is claimed is:

1. An improvement for a bonding tool used in bonding electrical leads from a beam leaded device onto mating conductive surfaces on a substrate, wherein said tool includes a main body portion having a longitudinal axis and an end surface substantially transverse thereto, a recessed holding area within said end surface for receiving and holding at least part of said beam leaded device, a bonding surface disposed near the periphery of said holding area for bonding said leads to said mating conductive surfaces on said substrate, a base member having a surface for positioning of said beam leaded device and said substrate substantially transverse to said longitudinal axis of said bonding tool and means for attaching said base member and positioning surface substantially under the end portion of said bonding tool, wherein said improvement comprises:

at least one easily distinguishable reference mark on the bonding tool disposed near the periphery of said bonding surface for aid in visually aligning said bonding surface of said bonding tool with respect to said electrical leads and also with respect to said mating conductive surfaces on said substrate wherein said surface of said base member for positioning of said beam leaded device and said substrate is a mirror surface for further facilitating the visual alignment of said electrical leads, mating conductive surfaces and substrate.

2. An improvement for a bonding tool as in claim 1 wherein said bonding surface is substantially rectangularly shaped and wherein said reference mark comprises a notch located substantially midway along one side of said bonding surface.

3. An improvement for a bonding tool as in claim 2 wherein said bonding surface is substantially rectangularly shaped and wherein said reference point comprises a notch in at least two adjacent corners of said bonding surface.

* * * * *